United States Patent [19]

Noda

[11] Patent Number: 5,344,788
[45] Date of Patent: Sep. 6, 1994

[54] METHOD OF MAKING FIELD EFFECT TRANSISTOR

[75] Inventor: Minoru Noda, Itami, Japan

[73] Assignee: Mitsubishi Denki Kabushiki Kaisha, Tokyo, Japan

[21] Appl. No.: 74,564

[22] Filed: Jun. 10, 1993

Related U.S. Application Data

[62] Division of Ser. No. 881,291, May 11, 1992, Pat. No. 5,296,398, which is a division of Ser. No. 673,339, Mar. 22, 1991, Pat. No. 5,153,683.

[30] Foreign Application Priority Data

Apr. 19, 1990 [JP] Japan .................. 2-104038

[51] Int. Cl.$^5$ .......................................... H01L 21/265
[52] U.S. Cl. ...................... 437/41; 437/909; 437/984; 437/912
[58] Field of Search ................ 437/40, 41, 44, 912, 437/909

[56] References Cited

U.S. PATENT DOCUMENTS

| | | | |
|---|---|---|---|
| 4,318,216 | 3/1982 | Hsu | 29/571 |
| 4,645,563 | 2/1987 | Terada | 156/643 |
| 4,769,339 | 9/1988 | Ishii | 437/39 |
| 4,859,618 | 8/1989 | Shikata et al. | 437/41 |
| 4,956,308 | 9/1990 | Griffin et al. | 437/41 |
| 4,962,054 | 10/1990 | Shikata | 437/40 |
| 4,992,387 | 2/1991 | Tamura | 437/41 |
| 5,001,077 | 3/1991 | Sakai | 437/41 |
| 5,036,017 | 7/1991 | Noda | 437/41 |
| 5,187,112 | 2/1993 | Kohno et al. | 437/41 |

FOREIGN PATENT DOCUMENTS

| | | |
|---|---|---|
| 0110320 | 8/1984 | European Pat. Off. . |
| 0152615 | 9/1985 | European Pat. Off. . |
| 0160255 | 11/1985 | European Pat. Off. . |
| 0177129 | 4/1986 | European Pat. Off. . |
| 0306039 | 3/1989 | European Pat. Off. . |
| 0392120 | 10/1990 | European Pat. Off. . |
| 2639762 | 6/1990 | France . |
| 63-107071 | 5/1988 | Japan . |
| 63-280462 | 11/1988 | Japan . |
| 240924 | 2/1990 | Japan . |
| 276236 | 3/1990 | Japan . |
| 348429 | 3/1991 | Japan . |
| 3232240 | 10/1991 | Japan . |
| 0402296 | 4/1990 | United Kingdom . |

OTHER PUBLICATIONS

Chakravarti et al, "Double-Diffused Metal-Oxide Silicon FET", IBM Technical Disclosure Bulletin, vol. 19, No. 4, 1976, pp. 1162–1163.

Kimura et al, "Asymmetric Implantation Self-Alignment Technique For GaAs MESFETs", Japanese Journal of Applied Physics, vol. 27, No. 7, 1988, pp. L1340–L1343.

Geissberger et al, "A New Refractory Self-Aligned Gate Technology For GaAs Microwave Power FET's And MMIC's", IEEE Transactions on Electron Devices, vol. 25, No. 5, 1988, pp. 615–622.

Enoki et al, "Optimization Of GaAs SAINT Structure For Non-Implanted MMIC", NTT Electrical Communications Laboratories, ED86-0, pp. 23–28 (date unknown).

Primary Examiner—George Fourson
Assistant Examiner—Richard A. Booth
Attorney, Agent, or Firm—Leydig, Voit & Mayer

[57] ABSTRACT

A field effect transistor having an asymmetric gate includes high dopant concentration source and drain regions. The drain region is shallower and of lower dopant concentration than the source region. The drain is spaced from the gate electrode. Therefore, an ideal FET having a reduced short channel effect and having a lower source resistance and high current drivability (gm) is obtained. When the drain region is produced by ion implantation through a film and the source region is produced by the implantation directly into the substrate, only the drain region is separated from the gate. When the insulating film on the source region is separated from the insulating film on the drain region, the insulating film on the source region is reliably selectively removed, whereby high controllability is obtained.

1 Claim, 7 Drawing Sheets

METHOD OF MAKING FIELD EFFECT TRANSISTOR

This application is a division of application Ser. No. 07/881,291, filed May 11, 1992 now U.S. Pat. No. 5,296, which itself is a division of application Ser. No. 07/673,339, filed Mar. 22, 1991, now U.S. Pat. No. 5,153,683.

FIELD OF THE INVENTION

The present invention relates to a field effect transistor (hereinafter referred to as "FET") having an asymmetrical gate and a production method thereof.

BACKGROUND OF THE INVENTION

Figure 7A:
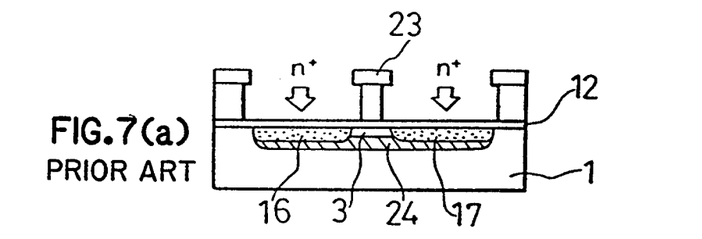
FIGS. 7(a)-7(b) are diagrams showing a prior art production method of an FET.
Figure 7B:
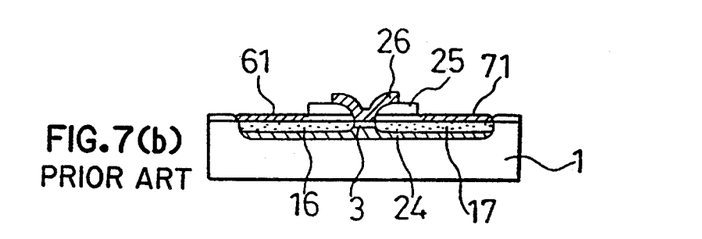

FIGS. 7(a) and 7(b) show a prior art production method of a self-aligned gate FET recited in Electronics Information and Communication Engineer's Society of Japan, Electronic Device Research Institute report, ED86-9, pp. 23 to 28, "Optimization of MMIC GaAs Advanced SAINT Structure" (reference No. 1).

In FIGS. 7(a) and 7(b) reference numeral 1 designates a GaAs substrate. A p well 24 is produced in the substrate 1. N-channel region 3 is produced in the p well 24. N+ ion implanted regions 16 and 17 constitute a source and a drain region, respectively. Numeral 12 designates a through-film for implantation comprising SiN which functions as a mask for ion implantation. Numeral 23 designates a dummy gate comprising a T-shaped photoresist. Numeral 25 designates a SiO₂ film. Numeral 26 designates a gate electrode. Numerals 61 and 71 designate a source and a drain electrode, respectively.

It is described in the reference No. 1 that an n+ion implantation is carried out using the T-shaped photoresist as a mask (FIG. 7(a)), and further a pattern inversion is carried out and the gate electrode is produced by the lift-off method, resulting in a structure shown in FIG. 7(b).

However, in the FET produced in this way, because the source and drain regions are symmetrical with respect to the gate electrode 26, the interval between the source region 16 and the drain region 17 is reduced as is of the gate length. The substrate leakage current between source and drain increases, thereby causing the short channel effect. In addition, when the distance between the gate and source is shortened to reduce the source resistance, the distance between the gate and drain is also necessarily shortened and the gate drain breakdown voltage is reduced.

In order to reduce the short channel effect and increase the gate drain breakdown voltage, conventional methods of producing an FET having an asymmetrical gate described in the following, is proposed.

Figure 8A:
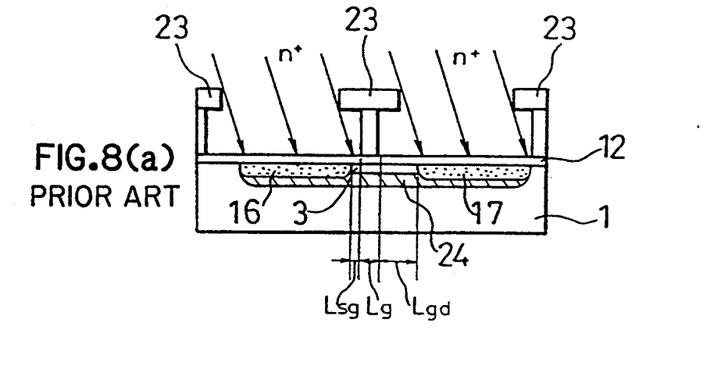
FIGS. 8(a)-8(b) are diagrams showing another prior art production method of an FET.
Figure 8B:
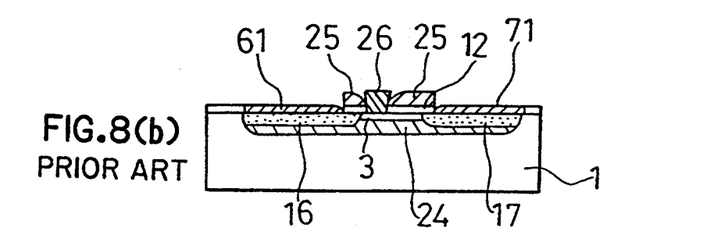

One of them, which is also recited in the reference No. 1, will be described with reference to FIGS. 8(a) and 8(b). In FIGS. 8(a) and 8(b) the same reference numerals designate the same parts as in FIGS. 7(a) and 7(b). It is described in the reference No. 1 that the device is produced as follows:

After p well 24 and n type layer 3 are produced by ion implantation, a plasma CVD SiN film 12 is deposited, and a T-shaped dummy gate 23 is produced thereon. Using this dummy gate 23 as a mask, n+ion implantation is carried out (FIG. 8(a)). The angle of ion implantation is determined such that the distance between the gate electrode and the end of the n+layer at the drain side (Lgd) is larger than the distance between the gate electrode and the source side (Lsg). Next, using an inverted pattern of dummy gate 23 as a mask, a Schottky Junction part is opened and Mo/Au is deposited by DC sputtering. Then, by flattening the Au using diagonal direction ion milling, a gate electrode 26 is produced only on the Schottky junction part and finally ohmic electrodes 61, 71 are produced by lift-off and sintered, thereby resulting in a device of FIG. 8(b).

The n+implanted layers which are produced by the diagonal direction ion implantation using the T-shaped gate electrode which is symmetric with respect to the source and drain as a mask results in a difference between the gate-source distance Lsg and the gate-drain distance Lgd. This makes it possible to reduce the source resistance and to enhance the gate drain breakdown voltage at the same time. Furthermore, this enables a long distance between the source and the drain region, resulting in reduction in the short channel effect.

FIGS 9(a)–9(h) show another prior art method of producing FET having an asymmetric self-aligned gate, which is recited in IEEE Transactions on Electron Devices, Vol. 35, No. 5, May 1988, pp. 615 to 622, "A New Refractory Self-Aligned Gate Technology for GaAs Microwave Power FET's and MMIC's" (reference. No. 2).

The production method will be described.

Figure 9A:
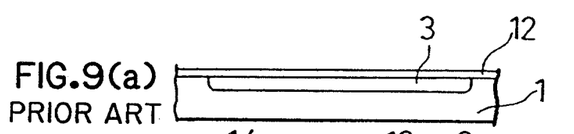
FIGS. 9(a)-9(h) are diagrams showing another prior art production method of an FET.
Figure 9B:
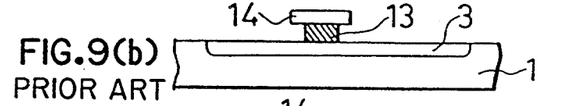

As shown in FIG. 9(a), a SiON film 12 is produced as through-film for implantation on a GaAs substrate 1, and thereafter, an active channel region 3 of FET is produced by selective ion implantation of silicon ions. Thereafter, the SiON film 12 is removed, a TiWN film is produced on the entire surface by sputtering, an etching mask comprising Ni 14 is produced at a gate electrode production region and the TiWN layer is processed so as to have a gate configuration 13 by reactive ion etching (FIG. 9(b)).

Figures 9C, 9D:
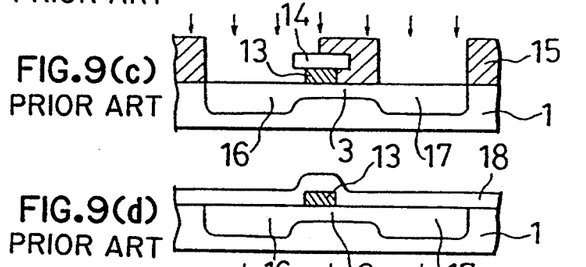
Figure 9E:
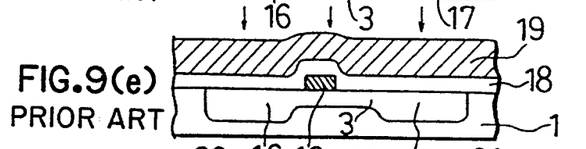
Figure 9F:
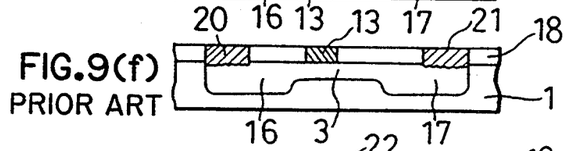

Next, a photoresist pattern 15 of a configuration that covers the drain side of the gate electrode 13 is produced as a mask for n+ ion implantation, and n+ ion implantation is carried out using the same as a mask to produce asymmetrical n+ ion implanted regions 16 and 17 among which the drain region is located farther from the gate electrode 13 than the source region (FIG. 9(c)).

Next, the photoresist 15 and Ni film 14 are removed, a SiON film 18 is provided on the entire surface of the substrate as a protection film which functions as an anneal cap, and then an annealing is carried out to activate the implanted ions in the regions 16 and 17 (FIG. 9(d)). Thereafter, a flattening photoresist 19 is provided on the entire surface of substrate (FIG. 9(e)), gate 13 is exposed by etching back, and ohmic metals 20 and 21 which are to be a source electrode and a drain electrode are produced by burying metal (FIG. 9(f)).

Figure 9G:
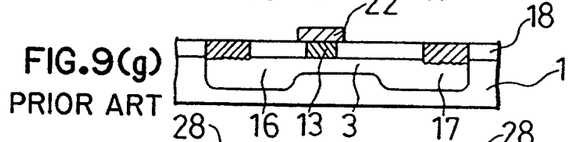
Figure 9H:
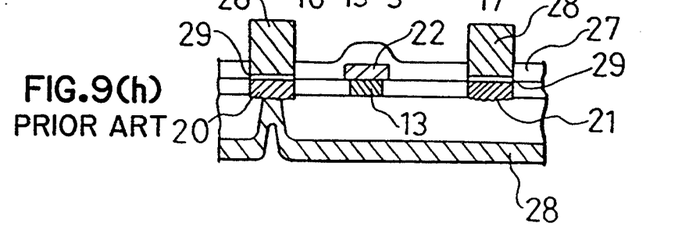

Next, a low resistance metal 22 of Ti/Au is produced on the gate electrode 13 by evaporation and lift-off (FIG. 9(g)), and thereafter a SiN film 27 is produced on the surface and Au electrodes 28 are produced on the ohmic electrodes 20 and 21 via TiWN layers 29. Further, an opening is provided at a part of the source electrode 20 from the rear surface of the substrate 1 and Au electrode 28 is plated on the rear surface covering the side wall of the opening and the entire rear surface of substrate, thereby completing the device (FIG. 9(h)).

In this production method, the photoresist pattern 15 is produced only covering the drain side of the gate electrode 13, n+ ion implantation of so that n+ layer producing ions are not implanted into the vicinity of the gate electrode at the drain side. Thus an asymmetrical gate FET is produced.

In the prior art production method shown in FIGS. 8(a) and 8(b) the asymmetry of the production position of n+ layer with respect to the gate is realized by a diagonal implantation, and the angle of the diagonal implantation varies depending on position in the GaAs wafer surface. The position of the end portion of n+ layer is likely to vary depending on the configuration of T-shaped gate which functions as an implantation mask. That is, the position where the n+ layer is produced is likely to be affected by variations in the configuration of T-shaped gate cause variations in characteristics.

In the prior art production method shown in FIGS. 9(a)-9(h), the photoresist mask which is produced at the drain side of the gate is position determined only by photolithography and therefore the positioning of the photoresist mask is quite unstable. That is, the precision of the photoresist mask largely depends on the performance of the photolithography apparatus and it may possibly vary from run to run. Therefore, an asymmetrical gate FET having a stable gate drain distance and a gate source distance as designed can not be produced with high reproducibility.

SUMMARY OF THE INVENTION

The present invention is directed to solving the abovedescribed problems and has for its object to provide a field effect transistor having an asymmetric gate that is produced by asymmetric implantation self-alignedly and having a gate drain distance and a gate source distance with high precision and reproducibility.

Another object of the present invention is provide a production method for such an FET.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

In accordance with a first aspect of the present invention, in a field effect transistor having an asymmetric gate structure, the drain layer is made shallower and of lower concentration than the source layer and only the drain layer is separated from the gate.

In accordance with a second aspect of the present invention, an insulating film is provided covering the substrate on which a gate electrode is produced, a photoresist pattern having an opening only at the source region is produced on this insulating film, the insulating film on the source region is selectively removed using the photoresist as a mask, and thereafter, using the insulating film on the gate electrode and the drain region as a mask, ion implantation is carried out, thereby producing source and drain layers.

In accordance with a third aspect of the present invention, side walls comprising an insulating film are produced at both sides of the gate electrode, a photoresist pattern having an opening only at the source region is produced, and the side wall at the side of the source region is selectively removed using a photoresist pattern as a mask, and ion implantation is carried out using the gate electrode and the side wall remaining at the side of drain region as mask, thereby producing source and drain layers.

In accordance with a fourth aspect of the present invention, a first insulating film is produced on the gate electrode, a second insulating film is provided to covering the entire surface of the substrate, this second insulating film is etched back to expose the first insulating film, a photoresist pattern having an opening only at a portion of the source region is provided, the second insulating film on the source region is selectively removed using the photoresist pattern as a mask, and thereafter the second insulating film on the drain region is processed so as to remain at the side of the gate electrode by etching and to become a side wall, ion implantation is carried out using the gate electrode and the second insulating film of the side wall part as a mask, and thus source and drain layers are produced.

In accordance with a fifth aspect of the present invention, a first insulating film is provided to covering the surface of substrate where a gate electrode is produced and etched back to expose the gate electrode; a second insulating film is produced so as to cover the gate electrode and the first insulating film at the drain side, a photoresist pattern having an opening only at a portion on the first insulating film on the source region is provided, the first insulating film on the source region is selectively removed using the photoresist pattern as a mask, and thereafter the first insulating film on the drain region is etched so as to remain at the side of the gate electrode and to become a side wall, and ion implantation is carried out using the gate electrode and the first insulating film at the side wall part as a mask to produce source and drain layers.

In accordance with the first aspect of the present invention, an ideal FET having a reduced short channel effect, a small source resistance and high current drivability (gm) can be obtained.

In accordance with the second aspect of the present invention, since the drain layer is formed by implantation through the other insulating film and the source layer is formed by implantation in the bare surface or through a film which is thinner than the through film for producing the drain layer, the drain layer is produced self-alignedly, has a separation from the gate which is almost determined by the thickness of the through film and is shallower and of lower dopant concentration than the source layer. Furthermore, the source layer is located closer to the gate than the drain layer is deeper and of a higher concentration than the drain layer, thereby realizing an FET which has a reduced short channel effect, a small source resistance and a high current drivability (gm) at a high controllability.

In accordance with the third aspect of the present invention, since only the drain layer is separated from the gate by a side wall insulating film only at the drain side end of the gate and the source layer is closer to the gate than the drain layer, the drain layer and the source layer are produced at the same depth and of the same concentration. Also in this case, an FET having a reduced short channel effect, a small source resistance and a high current drivability (gm) is obtained.

In accordance with the fourth aspect of the present invention, since a first insulating film comprising a material different from that of the second insulating film on the source and drain region is provided only direct by above the gate electrode and the second insulating film on the source region is selectively removed, the selective removal of the second insulating film on the source region can be reliably carried out for asymmetrical ion implantation for producing the drain and the source layers.

In accordance with the fifth aspect of the present invention, since a second insulating film comprising a material different from the first insulating film on the source region is provided in contact with the first insulating film on the gate electrode and on the drain region, the selective removal of the first insulating film on the source region can be reliably carried out.

BRIEF DESCRIPTION OF THE DRAWINGS

FIGS. 4(a)-4(f) are diagrams showing a production method for producing the FET of FIG. 3;

DETAILED DESCRIPTION OF THE PREFERRED EMBODIMENTS

An embodiment of the present invention will be described in detail with reference to the drawings.

FIG. 1 and FIGS. 2(a)-2(f) respectively show a cross-sectional structure of an FET and a process flow of production method of an FET according to a first embodiment of the present invention. In these figures, reference numeral 1 designates a GaAs substrate. Numeral 2 designates a refractory metal gate and numeral 3 designate an n-channel region produced at the surface of the substrate 1. Numerals 4 and 5 designate a source n+ layer and a drain n+ layer, respectively. Numeral 41 designates a source electrode and numeral 51 designates a drain electrode. Numeral 6 designates an insulating film. Numerals 7 and 7' designate photoresist patterns and reference numeral 8 designates an opening in the photoresist 7.

A description is given of the production method.

Silicon ions are implanted by selective ion implantation into the GaAs substrate 1 at an energy of 10 to 50 keV and at a dose of $1 \times 10^{12}$ to $1 \times 10^{14} cm^{-2}$. Thereafter a film of AlN, SiN, SiON or SiO (not shown) is deposited on the substrate 1 to a thickness of approximately 100 to 1000 angstroms as a through-film for implantation and silicon ions are implanted through that film at an energy of 30 to 100 KeV and at a dose of approximately $1 \times 10^{12}$ to $1 \times 10^{14} cm^{-2}$, thereby producing an n-channel region 3. Thereafter, a refractory metal such as tungsten silicide is deposited on the entire surface of the substrate and processed to a gate configuration 2 (FIG. 2(a)).

Figures 2A, 2B, 2D, 2E, 2F:
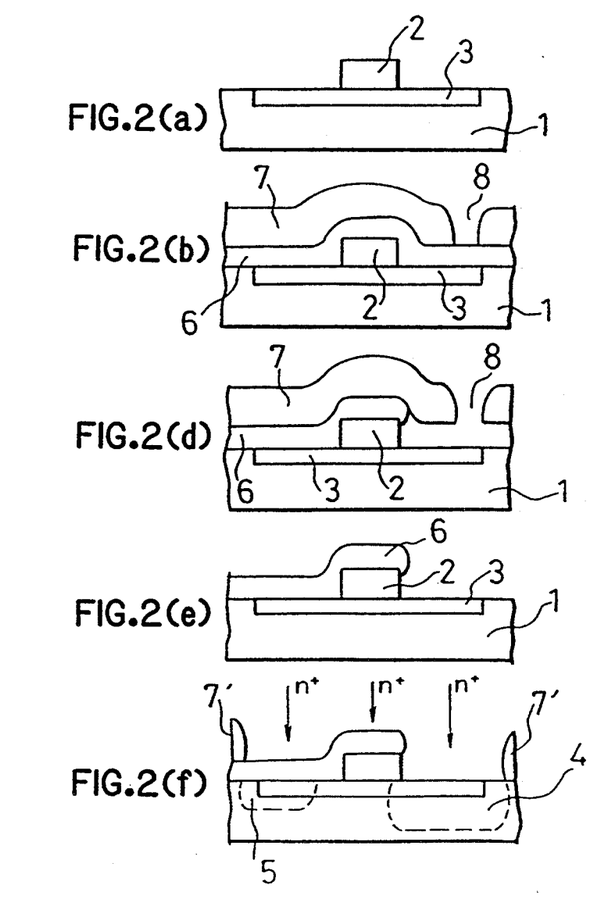
FIGS. 2(a)-2(f) are diagrams showing a production method for producing the field effect transistor of FIG. 1.
Figure 2C:
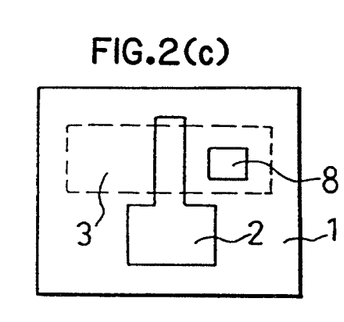

Next, SiON 6 (first insulating film) is deposited on the surface of the substrate 1 and the refractory gate 2 to a film thickness of approximately 1000 to 10000 angstroms, and a photoresist pattern 7 having an opening 8 at a part of source region is produced thereon (FIG. 2(b)). FIG. 2(c) shows a view from just above the substrate.

Next, the insulating film 6 is etched by a method such as plasma etching as shown in FIG. 2(d) and only the insulating film 6 at the source region is removed.

Thereafter, as shown in FIG. 2(e), the photoresist 7 is removed and the photoresist pattern 7' for determining the end of source region and the end of drain region is produced silicon ion implantation is carried out to produce the n+ regions using this photoresist pattern as a mask at an energy of 20 to 200 keV and at a dose of $1 \sim 10 \times 10^{13} cm^{-2}$ or more. Thus, a shallow and low concentration drain n+ layer 5 which is separated from the gate and a deep and high concentration source n+ layer 4 in contact with the gate are produced.

Figure 1:
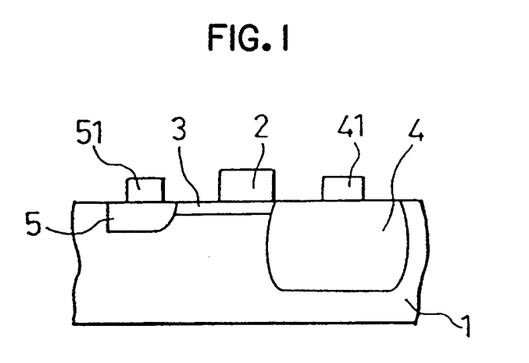
FIG. 1 is a diagram showing a cross-sectional structure of a field effect transistor according to a first embodiment of the present invention.

Thereafter, the photoresist 7' and the insulating film 6 are removed and the source electrode 41 and the drain electrode 51 are produced to complete an element of FIG. 1.

In this embodiment, without using photolithographic mask alignment for producing an ion implantation mask, a drain n+ layer 5 having a separation from the gate 2 corresponding approximately to the film thickness of the insulating film 6 and a source n+ layer 4 close to the gate electrode 2 are produced self-alignedly at high precision. Further, the drain n+ layer 5 is shallow and of low concentration and the source n+ layer 4 is deep and of high concentration. Therefore, the drain breakdown voltage is enhanced and the short channel effect and the source resistance are reduced. Thus a high efficiency FET having a high transconductance gm can be produced with high controllability and high reproducibility.

Figure 3:
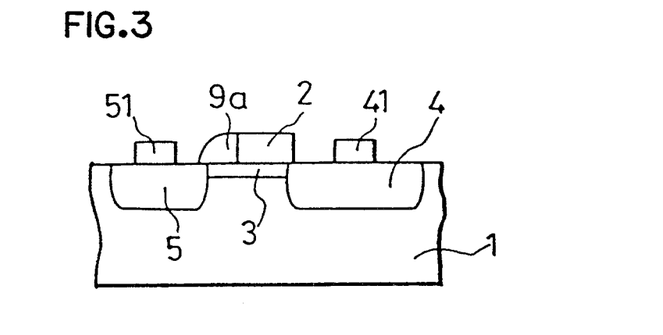
FIG. 3 is a diagram showing a cross-sectional structure of obtained by the production an FET according to a second embodiment of the present invention.
Figure 4A:
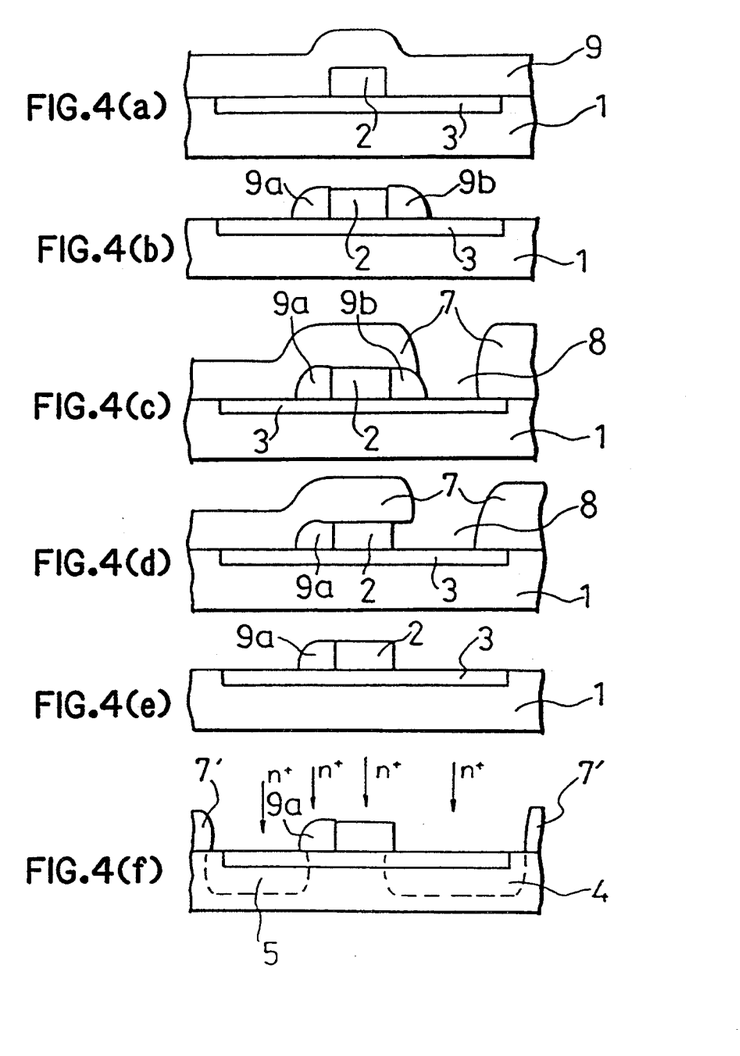

FIG. 3 shows a cross-sectional structure of an FET according to a second embodiment of the present invention and FIGS. 4(a)-4(f) show a production process of that structure. In these figures, the same reference numerals designate the same portions as those in FIGS. 1 and 2. Reference numeral 9 designates an insulating film and reference numerals 9a and 9b designate side walls comprising the insulating film 9.

A description is given of a production method.

The processes that produce an n-channel region 3 by selective ion implantation on the GaAs substrate 1, a refractory metal such as tungsten silicide on the entire surface of the substrate and a gate configuration 2 are the same as those shown in FIG. 2(a). In this embodiment, subsequently an insulating film 9 is deposited on the surface of substrate 1 and the surface of gate electrode 2 to cover the same (FIG. 4(a)). Thereafter, the insulating film 9 is etched leaving side walls 9a and 9b at the both sides of the gate electrode 2 (FIG. 4(b)).

Then, a photoresist is applied so as to cover the surface of the substrate 1, the gate electrode 2, and the insulating film side walls 9a and 9b, and etching is carried out to produce an opening 8 at the photoresist 7 (FIG. 4(c)) so as to expose a portion of the surface of the side wall 9b at the source side and a portion of the substrate 1 at the source side region.

Next, the insulating film side wall 9b is etched and removed (FIG. 4(d)) using such as plasma etching, by the same process as that shown in FIG. 2(d).

Thereafter, as shown in FIG. 4(e), after the photoresist 7 is removed, photoresist pattern 7' is produced and ion implantation for producing n+ regions is carried out using the photoresist 7' as a mask, so that a drain n+ layer 5 separated from the gate and a source n+ layer 4 in contact with the gate are produced (FIG. 4(f)).

Thereafter, after the photoresist 7' is removed, a source electrode 41 and a drain electrode 51 are produced, thereby completing the element of FIG. 3.

This embodiment is different from the first embodiment described above in that the separation between the gate electrode 2 and the drain n+ layer 5 is self-alignedly determined by the width of the insulating film side wall 9a. In this embodiment, since the insulating film 9b on the source n+ region and the insulating film 9a on the drain n+ region are produced with the gate electrode 2 therebetween, the insulating film 9b on the source n+ region is easily and selectively removed with high controllability. Furthermore, in this embodiment, since no variation in position of n+ layer edge is caused by an unstable implantation such as diagonal ion implantation or by an implantation mask produced by photolithography, the separation of the source n+ layer and the drain n+ layer from the gate electrode 2 can be set to desired values with high precision is obtained with high reproducibility and high controllability. Furthermore, in this production method, the source n+ layer 4 and drain n+ layer 5 have the same concentrations and the same dopant depths in contrast to the above described embodiment. Whether the structure and the production method of the above described embodiment or those of this embodiment are to be adopted may be selected in accordance with the use of the element.

Next, third and fourth embodiments of the present invention which are alternatives of the first and second embodiments will be described.

In these embodiments a stopper that prevents removal of the insulating film just above the gate and the insulating. film above the drain n+ layer is produced while the insulating film on the source n+ layer is selectively removed, thereby enhancing the preference of etching. That is, different kinds of insulating films having different etching properties are inserted so that the source n+ layer insulating film and the drain n+ layer insulating film are not connected with each other as the same film.

FIGS. 5(a)-5(g) show a production process of this third embodiment.

Figure 5A:
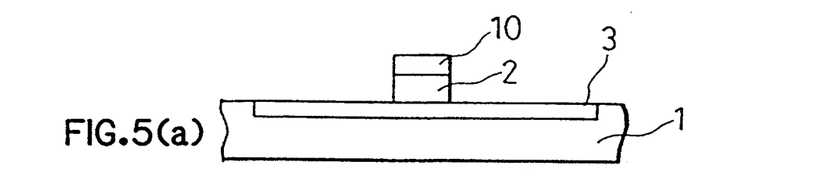
FIGS. 5(a)-5(g) are diagrams showing a production method of an FET according to a third embodiment of the present invention.
Figure 5B:
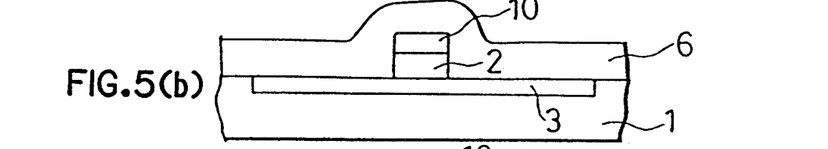

As shown in FIG. 5(a), a refractory gate is produced on the n-channel region 3 of GaAs substrate 1, an insulating film (first insulating film) 10 is deposited thereon and these are processed to a gate configuration in a two layer structure. Thereafter an insulating film (second insulating film) 6 having an etching property different from that of the first insulating film 10 is provided on the entire surface (FIG. 5(b)).

Figure 5C:
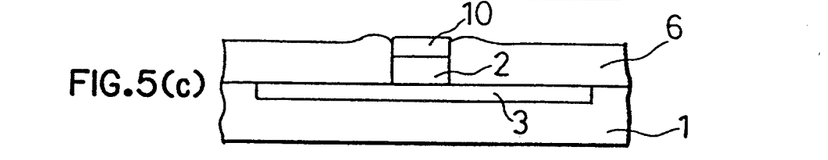
Figure 5D:
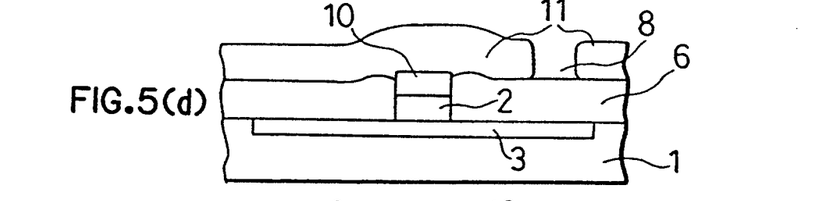

Thereafter, the second insulating film 6 is etched back to expose the surface of the first insulating film 10 (FIG. 5(c)), a photoresist 11 is provided on the entire surface and an opening 8 which reaches the second insulating film 6 is produced at a portion of the photoresist 11 on the source n+ region (FIG. 5(d)).

Thereafter, the second insulating film 6 on the source n+ region is selectively removed by etching using this photoresist pattern 11 as a mask. Here, in a case where SiN is used for the second insulating film 6 and SiO₂ or SiO is used for the first insulating film 10, plasma etching (PE) using SF₆ for the selective removal of the first insulating film is preferable and it is possible for the second insulating film 6 to have a large selectivity relative to the first insulating film 10. Furthermore, when SiO₂ or SiO are used for the second insulating film 6 and SiN is used for the first insulating film 10, it is quite effective to utilize reactive ion etching using CHF₃+C₂H₆ for the selective removal of the second insulating film 6.

Figure 5E:
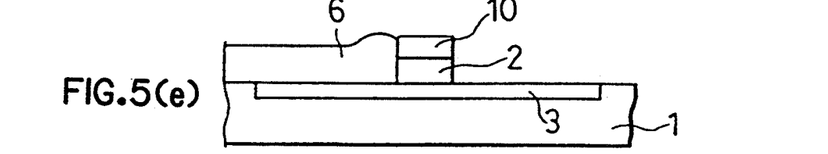
Figure 5F:
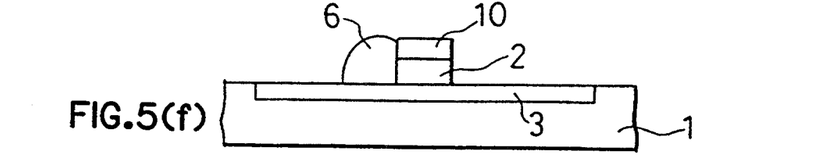

Next, as shown in FIG. 5(e), after the photoresist 11 is removed, the second insulating film 6 remaining on the drain n+ region is etched and processed so as to remain only as a side wall at the gate electrode drain side. At this time, since the width of this side wall becomes the distance between the gate and the drain n+ region, it should be previously produced at a design value.

Figure 5G:
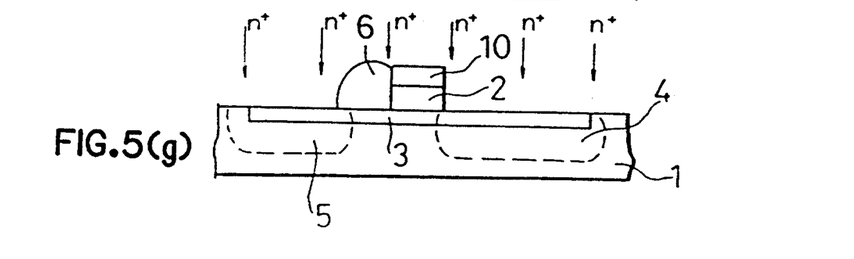

Next, as shown in FIG. 5(g), ion implantation for producing n+ regions is carried over the entire surface of the substrate and a drain n+ region 5 separated by a predetermined distance from the gate electrode 2 and a source n+ region 4 in contact with the gate electrode 2 are produced self-alignedly with the gate electrode and the second insulating film side wall 6.

A production process flow of the fourth embodiment will be described with reference to FIGS. 6(a)-6(g).

Figure 6A:
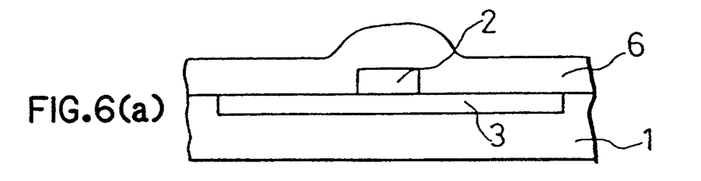
FIGS. 6(a)-6(g) are diagrams showing a production method of an FET according to a fourth embodiment of the present invention.
Figure 6B:
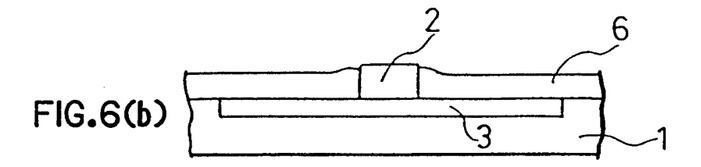

As shown in FIG. 6(a), a refractory gate 2 is produced at the surface of GaAs substrate 1 on which the n-channel region 3 is produced and the first insulating film 6 is deposited on the entire surface so as to cover the surface of the substrate 1 and the gate 2. Thereafter, the first insulating film 6 is etched back to expose the surface of the gate electrode 2 (FIG. 6(b)).

Figure 6C:
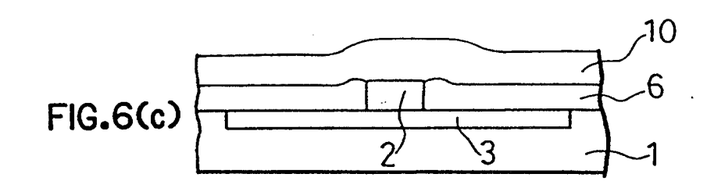
Figure 6D:
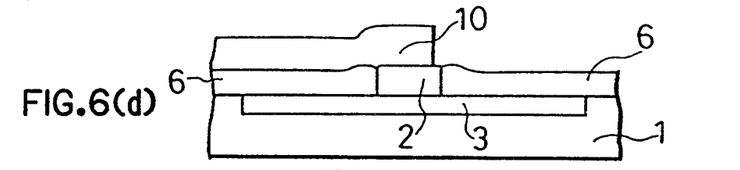

Thereafter, a second insulating film 10 having a different etching property of from that of the first insulating film 6 is provided so as to cover the entire surface of the first insulating film 6 and the exposed gate electrode 2 (FIG. 6(c)). This insulating film 10 is processed so as to remain only at the surface of the gate electrode 2 and the surface of the first insulating film 6 on the drain n+ region (FIG. 6(d)).

Figure 6E:
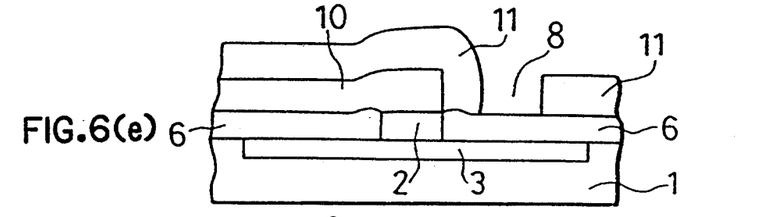
Figure 6F:
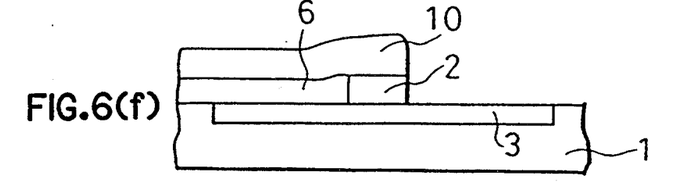
Figure 6G:
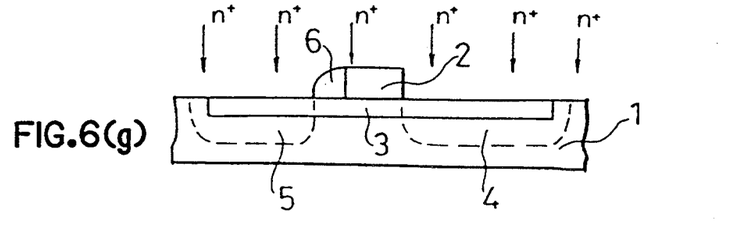

Next, as shown in FIG. 6(e), a photoresist pattern 11 having an opening 8 at a portion on the source n+ region is provided, and using the etching conditions described with respect to the process of FIG. 5(d) of the above described embodiment only the first insulating film 6 on the source n+ region is selectively removed. After the photoresist 11 is removed (FIG. 6(f)), the second insulating film 10 is removed and thereafter the remaining first insulating film 6 is processed so as to remain only as a side wall of the gate electrode on the drain side. The ion implantation for producing n+ layers is carried out using the gate electrode 2 and the side wall insulating film 6 as a mask. The drain n+ region 5 is produced separated from the gate electrode by the width of the side wall and a source n+ region 4 is produced adjacent to the gate electrode 2.

In the above described third and fourth embodiments, a different kind of insulating film 10 that has a different etching property of is inserted in order that the insulating film 6 on the source n+ layer and the insulating film 6 on the drain n+ layer are not connected with each other as the same film. In this production method, the insulating film 6 on the source n+ layer and the insulating film 6 on the drain n+ layer are separated and so selective removal of only the insulating film 6 on the source n+ layer is reliably carried out.

In the above illustrated embodiments, only GaAs MESFETs are described, but transistors in which respective layers are provided parallel to the substrate surface such an HEMT, MIS-like FET or Si MOSFET can be constructed with the same effects.

While in the above illustrated embodiments, GaAs is used for the substrate material 1, silicon or InP can be used therefor.

In summary, in the above described first embodiment, a drain n+ layer and a source n+ layer are self-alignedly produced with a separation from the gate to drain length corresponding to the film thickness of the insulating film 6, by ion implantation using the insulating film 6 which is produced by high controllability etching, without using a mask produced by photolithography or without using diagonal ion implantation method. The drain and source are produced such that the former is shallow and of low concentration and the latter is deep and of high concentration. Therefore, a high efficiency FET having a high drain breakdown voltage, a reduced short channel effect, a small source resistance, and a high transconductance gm can be produced with high reproducibility and high controllability. In the second embodiment of the present invention, while the same effects as the first embodiment are obtained, the separation length between the drain n+ layer and the gate is determined self-alignedly by the width of the side wall 9. In addition, in the third and fourth embodiments, since the insulating film on the source n+ layer and the insulating film on the drain n+ layer are separated, the insulating film on the source n+ layer can be reliably selectively removed.

As is evident from the foregoing description, in accordance with present invention, since a drain n+ layer is shallow and of low concentration compared with the source n+ layer and only the drain n+ layer is separated from the gate in an FET having an asymmetric gate, a high efficiency FET having a reduced short channel effect, reduced source resistance, high transconductance, and high drain breakdown voltage is obtained.

In addition, when the drain n+ layer is produced by the implantation through the insulating film and the source n+ layer is produced either by implantation on a bare surface or by implantation through a film thinner than the implantation through film for producing the drain n+ layer, only the drain n+ layer is separated from the gate. Then, a good efficiency FET having reduced short channel effect, reduced source resistance, improved transconductance, and improved drain breakdown voltage is self-alignedly produced with high controllability and high reproducibility, without utilizing diagonal implantation which introduces an instability. This means that a high efficiency FET having stable characteristics from run to run is produced. In addition, when a structure in which the insulating film on the source n+ layer is separated from the insulating film on the drain n+ layer is obtained in the fabrication process, the insulating film on the source n+ layer can be reliably selectively removed, thereby resulting in high controllability and high reproducibility in the fabrication process.

What is claimed is:

1. A production method of a field effect transistor comprising:

producing a gate electrode on a substrate;

depositing a first insulating film covering said gate electrode and said substrate;

etching said first insulating film to expose said gate electrode;

depositing a second insulating layer comprising a material different from that of said first insulating film on said first insulating film and removing part of said second insulating layer, leaving a second insulating layer only at a first side of said gate electrode and on said gate electrode;

depositing a photoresist layer and patterning said photoresist layer to leave a photoresist film on said first and second insulating films, said photoresist film having an opening at and exposing part of said first insulating film at a second side of said gate electrode on the opposite side of said gate electrode from the first side of said gate electrode and selectively removing said first insulating film at the second side of said gate electrode using said photoresist film as a mask;

removing said photoresist film and said second insulating film;

etching said first insulating film remaining on said substrate to leave a side wall of said first insulating film at the first side of said gate electrode; and implanting ions using said gate electrode and said side wall of said first insulating film as masks to produce source and drain regions in said substrate.

* * * * *